United States Patent
Lang et al.

(10) Patent No.: US 7,065,676 B1
(45) Date of Patent: Jun. 20, 2006

(54) MULTI-THREADED MEMORY MANAGEMENT TEST SYSTEM WITH FEEDBACK TO ADJUST INPUT PARAMETERS IN RESPONSE TO PERFORMANCE

(75) Inventors: Michelle J. Lang, Minneapolis, MN (US); William Judge Yohn, Shoreview, MN (US)

(73) Assignee: Unisys Corporation, Blue Bell, PA (US)

( * ) Notice: Subject to any disclaimer, the term of this patent is extended or adjusted under 35 U.S.C. 154(b) by 577 days.

(21) Appl. No.: 10/330,714

(22) Filed: Dec. 27, 2002

(51) Int. Cl.
*G06F 11/00* (2006.01)

(52) U.S. Cl. .......................... 714/33; 714/32
(58) Field of Classification Search ............ 714/32
See application file for complete search history.

(56) References Cited

U.S. PATENT DOCUMENTS

| | | | | |
|---|---|---|---|---|
| 5,708,774 | A * | 1/1998 | Boden | 714/38 |
| 5,953,530 | A * | 9/1999 | Rishi et al. | 717/127 |
| 6,282,527 | B1 * | 8/2001 | Gounares et al. | 706/13 |
| 6,405,326 | B1 * | 6/2002 | Azagury et al. | 714/38 |
| 6,522,995 | B1 * | 2/2003 | Conti et al. | 702/186 |
| 6,625,760 | B1 * | 9/2003 | Man et al. | 714/33 |
| 6,647,513 | B1 * | 11/2003 | Hekmatpour | 714/37 |
| 6,795,790 | B1 * | 9/2004 | Lang et al. | 702/123 |
| 6,889,159 | B1 * | 5/2005 | Klotz et al. | 702/122 |
| 6,918,098 | B1 * | 7/2005 | Smith et al. | 716/4 |

OTHER PUBLICATIONS

Newton's Telecom Dictionary, "IP Addressing", Feb. 2002, CMP Books, 18th Edition, p. 393.*
Cataldo et al., "Optimal Hardware Pattern Generation for Functional BIST", 2000, ACM.*
Choi et al. "Techniques for Debugging Parallel Programs with Flowback Analysis", 1991, ACM.*

* cited by examiner

*Primary Examiner*—Scott Baderman
*Assistant Examiner*—Gabriel Chu
(74) *Attorney, Agent, or Firm*—Charles A. Johnson; Mark T. Starr; Crawford Maunu, PLLC

(57) ABSTRACT

A system and method for testing memory management functions of a data processing system. A controller is configured to start and monitor progress of one or more programs, and each of the one or more programs is configured to start a number of threads as specified by input parameter values. At least one or more of the threads are configured to create, modify, and delete one or more memory areas. A feedback activity measures performance characteristics of the data processing system while the one or more threads are executing and selectively adjusts the parameter values in response to the performance characteristics relative to target performance characteristics.

21 Claims, 4 Drawing Sheets

MULTI-THREADED MEMORY MANAGEMENT TEST SYSTEM WITH FEEDBACK TO ADJUST INPUT PARAMETERS IN RESPONSE TO PERFORMANCE

FIELD OF THE INVENTION

The present invention relates to testing memory management functions of a data processing system.

BACKGROUND OF THE INVENTION

Computer system testing generally seeks to uncover design and implementation errors by creating processing conditions that attempt to replicate real-world conditions. Oftentimes the time and resources required to adequately test a system are strained because of product delivery commitments. Thus, developing automated test suites with thorough coverage of system functionality is very important.

One system-level function that is usually the object of a system test is the functionality that manages the memory or "main storage" of a data processing system. Testing the main storage management functionality of a data processing system is extremely complex. The main storage management implemented in the 2200 Series data processing systems from Unisys is used as an example to illustrate the complexity.

The 2200 operating system contains a complex memory management system that maintains its system memory on behalf of itself and all its users. In order for a program to access physical memory, two conditions must be met. First, the addresses within the program must be translated and adjusted to meet the architectural and physical requirements of the system memory. Second, the requirements for accessibility must be met.

When a program is written it is normally written as a collection of individual instruction groups called subroutines. Addresses within these subroutines are either subroutine relative or symbolic if they reference another subroutine. When a compiler, or assembler, compiles or assembles these subroutines into a machine language object module, the object module is divided into logical groups called banks. Each bank contains a number of locations with each location being identifiable by its address. The compiler or assembler collects a number of subroutines in each bank and assigns each bank a range of addresses consisting of a logical bank number (LBN) and an offset relative to the start address of that particular bank.

A compiled program resides in a program file on system mass storage in the form of an object module. It consists of a number of virtual (logical) banks created by a compiler or assembler. A typical object module includes a code bank, a data bank, a link vector bank and a symbolic debugging dictionary bank.

In order for a program to be executed, each of the program's banks must be loaded into the system's physical memory. To do so, each program bank must have all symbolic references resolved. Any address relocation needed due to a subroutine's position within a bank or duplicate addresses within multiple banks must be completed. The process of resolving address references is called linking. The bank's addresses must then be translated into a form that coincides with the system architecture (L, BDI, Offset). These addresses are called virtual addresses because they do not relate to a specific set of physical storage locations. Linking may be performed prior to a program's execution ("static linking"). This removes the overhead inherent in assigning and translating addresses each time the program is executed. However, under certain conditions, it may be desirable to perform this function at execution time ("dynamic linking").

When a program is executed its virtual banks must be loaded into physical memory. To do so a physical bank is built from each virtual bank and then loaded into memory. When building each physical bank, its virtual addresses must be translated to the physical locations in system memory to be occupied. Each physical bank has associated with it a number of properties including type, size, limits, protection level, sharing level, storage type, and access level. These properties are stored within a data structure called a "bank descriptor," which is located within another data structure called a "bank descriptor table." Each bank descriptor in a bank descriptor table (BDT) is accessed via an index called the bank descriptor index (BDI).

Within the 2200 system architecture the addressing environment is managed within 8 levels (L0–L7) with each level relating to the degree of access locality. A hardware structure exists for the pointer to the bank descriptor table for each access level. From the user's perspective, the locality levels are activity, program, application and system. This means that certain physical banks can be accessed only by a given activity within a multi-activity program, that certain banks can be accessed by all activities within a program, and that certain banks can be accessed by all activities within multiple programs. The system level banks are not directly accessible by a program. Banks built at level 7 are the most local.

It is often desirable to create a program to perform a function that can be accessed by multiple users with the appropriate security and access privileges but is partitioned from the rest of the system. Within the 2200 operating system it is possible to create such a structure. The structure includes a group of shared object modules and a definition element and is called a fixed gate subsystem. Access to a fixed gate subsystem is controlled by a combination of hardware and software mechanisms. The entry points to such a structure are fixed hence the term 'fixed gate' subsystem. The owner of the subsystem controls how it is accessed and how it is protected from other users and subsystems. Banks within a fixed gate subsystem are built at application level. Ordinary (non-shared) object modules are executed within a special default subsystem (not a fixed gate subsystem) called the 'home subsystem'.

As the 2200 operating system supports virtual memory addresses larger than the available physical memory, programs can be constructed that exceed the size of the system's physical memory. This means that not all banks of a given program can be loaded in memory simultaneously and remain for the duration of a program. When a program is first executed, its initial bank group is loaded. The timing of how and when additional banks are loaded into the system memory is determined by how the banks are linked and referenced.

In addition to the banks that exist within a program at execution time, new banks may be dynamically created, deleted and have their properties modified from within the program. Banks that exist at program execution can only be modified.

Testing the memory and related aspects of large multi-processor systems, such as the 2200 series, with their vast number of supporting structures and mechanisms presents a major problem. The capability to execute many programs simultaneously, each having the ability to access memory and alter many of the supporting structures creates an almost infinite number of inter-related operational sequences. It is impossible to predict the timing of such sequences let alone creating a sufficient number of these sequences to provide a high level of confidence in the system's integrity.

Traditionally, system memory management has been tested using a number of individual programs, each performing one or more specific functions. Given the complexity of the memory management system, whether a given combination of programs would create a desired test condition has largely been a matter of chance.

A method and apparatus that addresses the aforementioned problems, as well as other related problems, are therefore desirable.

SUMMARY OF THE INVENTION

The invention provides supports testing memory management functions of a data processing system. A controller is configured to start and monitor progress of one or more programs, and each of the one or more programs is configured to start a number of threads as specified by input parameter values. At least one or more of the threads are configured to create, modify, and delete one or more memory areas. A feedback activity measures performance characteristics of the data processing system while the one or more threads are executing and selectively adjusts the parameter values in response to the performance characteristics relative to target performance characteristics.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which.

DETAILED DESCRIPTION

Various embodiments of the invention provide an arrangement for testing the main storage management functions of a data processing system. The embodiments are described relative to the 2200 Series systems from Unisys. However, those skilled in the art will appreciate that these teachings could be applied and adapted to other architectures without departing from the claims.

In one embodiment, the test arrangement controls the number of individual programs operating simultaneously, how each of these programs operates and the intended area of focus of a test. With input of a number of parameters, the arrangement is capable of producing most any operational condition that may exist within a memory system. No program code modifications are needed to test a different system of the same platform architecture or produce a different area of focus within a given system.

The test arrangement allows multiple runs, programs, and activities of various types to share access to memory areas or "banks". It allows dynamic creation, modification, and deletion of banks—along with concurrent access to pages (memory and I/O). Data are verified using address-tags. A controller maintains the desired number of active runs, and the amount of absolute, virtual, and real address space being used. Using session input parameters, testing may be focused in areas, such as inducing a large number of subsystem transitions and inter-subsystem references, stressing the absolute address space allocation algorithm, maintaining high page fault rate, simulating a typical NPE environment, stressing the working set management algorithm, maintaining high page I/O rate, creating a single arrant subsystem, or creating a user-defined environment.

Figure 1:
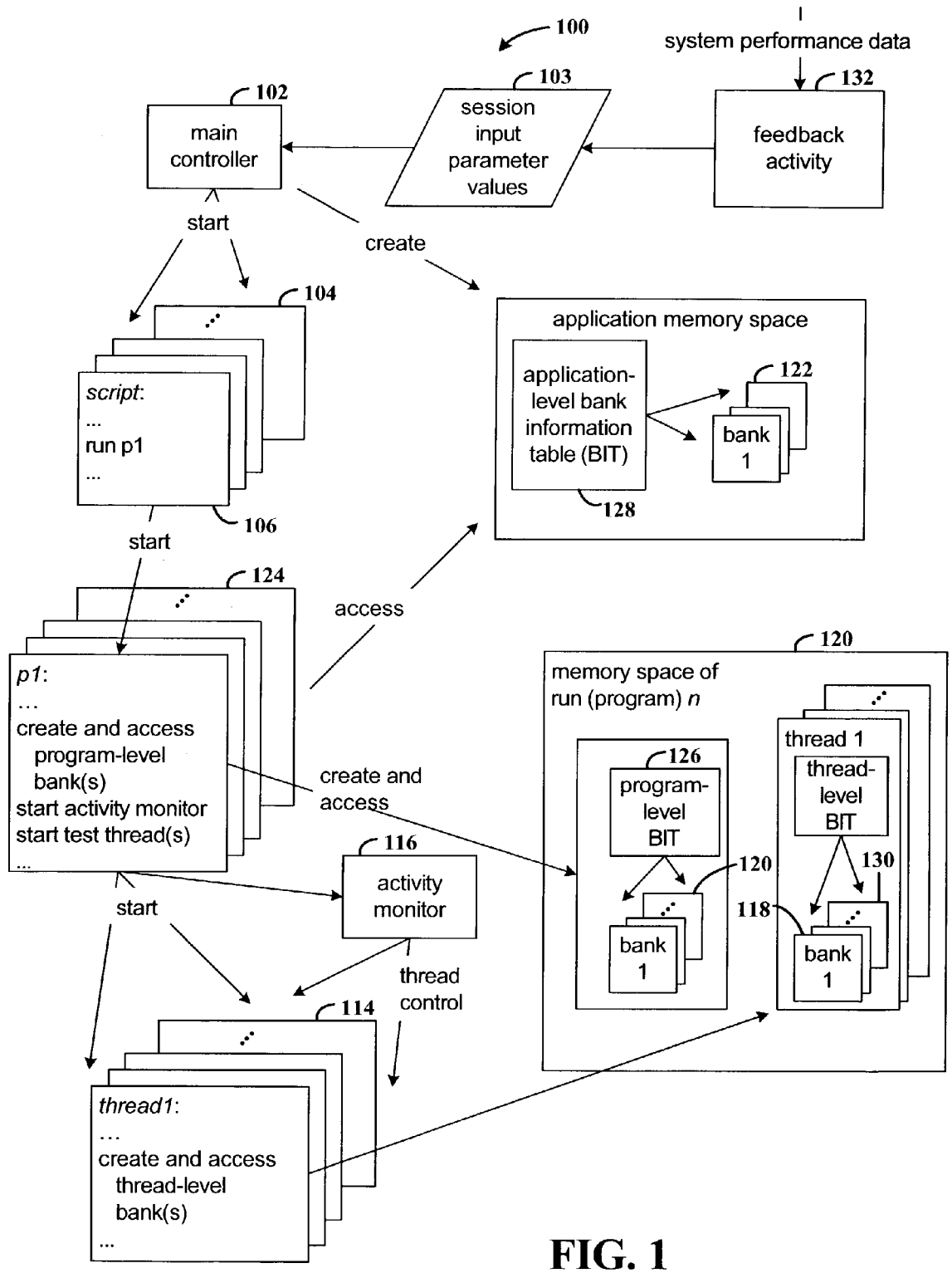
FIG. 1 is a functional block diagram of an arrangement for testing memory management functions of a data processing system in accordance with one embodiment of the invention.

FIG. 1 is a functional block diagram of an arrangement 100 for testing memory management functions of a data processing system in accordance with one embodiment of the invention. A main controller 102 provides overall management over the test arrangement. The main controller reads session input parameters values 103, which are chosen to control different aspects of a test session.

The main controller starts one or more of scripts 104 ("runs" in 2200 lexicon). The times at which the scripts are initiated depends on test-specific objectives. Each script is configured to execute a test program and perform any necessary pre-execution and post-execution activities. Each script runs a program, for example, script 106 starts program p1. Each program may start one or more threads (or "activities") 114, along with activity monitor 116. The activity monitor controls tasks performed by threads 114.

Memory banks at different levels are created. For example, thread1 creates and accesses one or more thread-level banks 118, and program p1 creates and accesses one or more program level banks 120. One or more application-level banks 122 are created by main controller 102 and are accessible by all of programs 124. At each level, a bank information table (BIT) is used for bookkeeping purposes. For example, program-level bank information table 126 is used with program-level banks 120, and application-level bank information table 128 is used with application-level banks 122. Each of thread-level banks 130 also has an associated bank information table.

The session input parameters 103 are also provided as input to the programs 124. Example uses of the parameters include controlling the number of threads, the number and types of memory operations, sizes and levels of memory banks and most any other attribute that might be used to affect testing memory management.

Feedback activity 132 is used to monitor system performance during a test session and adjust parameter values based on system performance characteristics relative to a chosen test objective. Session input parameter values 103 are updated and provided for use in the next test session.

The following paragraphs further explain various aspects of test arrangement 100 that may be used in selected and controlled combinations for memory management testing.

The design includes support for multiple active runs. A run includes one or more programs executed in sequence, and each program includes one or more active threads. Each program makes use of a set of pre-defined macros, allowing it perform the following types of activities:

create dynamic banks;
delete dynamic banks;

modify dynamic banks;
include static banks;
dynamic link to library OM(s);
make subsystem transitions;
create multiple threads;
initiate, terminate, and monitor tasks;
read or write pages; and
perform I/O to pages.

These macros make calls to corresponding library routines, which are statically (or dynamically) linked into each program. Programs may include calls to all routines, or some subset of those available, depending on the test objective. Programs may invoke the routines in fixed sequences, or they may use the activity monitor 116 to keep the desired level of activity in each of the main storage management routines. The following examples illustrate a few typical programs.

The code in Example 1 illustrates a single thread that executes a loop of instructions that create, modify, and delete memory banks.

```
           Setup_main
         ┌─Loop
         │   Create_banks
         │   Modify_banks
         │   Delete_banks
         └─Repeat loop
```

In Example 2, multiple activities perform the tasks of creating, referencing, and delete memory banks.

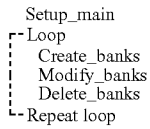

```
Setup_main
Create_activities
Create_banks
Reference_pages
Perform_page_io
Reference_pages
Perform_page_io
Delete_banks
```

The code in Example 3 has multiple threads and static banks. Each main storage management function is executed, and the distribution of types of activities is controlled by the activity monitor.

```
                              Example 3
Setup_main
Include_static_banks
Start_clock
Create_activities
Perform_msm_functions
```

Example 4 shows multiple threads and dynamic linking. Each main storage management function is executed, and the distribution of types of activities is controlled by the activity monitor.

```
                              Example 4
Setup_main
Dynamic_Link
Start_clock
Create_activities
Perform_msm_functions
```

In Example 5, there are multiple activities, which initiate subsystem transitions prior to referencing pages.

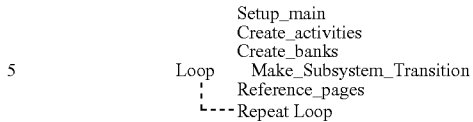

```
          Setup_main
          Create_activities
          Create_banks
    Loop    Make_Subsystem_Transition
      │     Reference_pages
      └─── Repeat Loop
```

Each program begins with a call to a setup routine, which is invoked with the macro setup_main, for example. This routine performs setup tasks that are required for all programs. These tasks include registering for contingencies and unsolicited program interrupts, and allocating working storage space required for providing the source for page reference and page-IO routines.

In addition, the setup routine allocates space for a program-level bank information table 126. As program-level static or dynamic banks are created, information on each bank is added to this table. Banks (and associated pages) referenced in this table are accessible by all threads in the program and may be modified, deleted, expanded, or contracted. The tables may provide the source or target for page reference routines or page I/O routines.

A single, thread-level bank information table is also created at this time. Banks described in this table are accessible only by the main thread. Later, if additional child threads are created (invoked with the Create_activities macro) new thread-level bank information tables will be created, one for each new thread.

The setup routine makes a call to a shared code bank, where it checks for an application level bank information table. If one does not already exist (as a result of another setup call) an application-level bank information table 128 will be created. Banks described in this table will be accessible by all active runs. A single application-level bank information table is created for use during a test session.

Using these macros a variety of programs of different durations and functionality may be created. Programs may be grouped together by attributes. For example, all programs which only create, delete, or modify banks (but never reference) may be grouped together. Short running programs may form another group. Programs that only perform I/O may form another group. Later, during execution, session input determines how many programs of each group should be kept active in order to achieve the desired effect.

Individual programs may be dynamically or statically linked in a variety of ways. The way in which a program is linked, and the way banks are grouped together to form bank groups affect the timing and way in which banks will later be loaded. For example, programs that are statically linked will have no unresolved references. Statically linked programs will be loaded by the linking system. Banks belonging to the initial bank group will be allocated in memory at this time, with contents coming from the program file located on disk. Additional data and code (located in bank groups different from the initial bank group) will be loaded at a later reference. Banks belonging to the same bank group will be loaded together. Rules govern how much data is preloaded.

Zero overhead object modules (ZOOM(s)) are loaded by the operating system. These modules have a faster load time, and rules for handling loading of banks belonging to the same bank group differ slightly from the rules applied by the Linking System.

Dynamically linked programs have references that remain unresolved until execution. During execution, the linking system resolves the reference using an internal search mechanism, and loads the target object module, which now joins the address space of the calling program.

Other supported program types include ZOOM(s) with CZASB (create zoom with activity(thread) level static banks) and batch-connect TIP transactions. Individual programs will vary the number of banks they include in the initial bank group, as well as the size and number of other (non-initial) bank groups.

A variety of programs of each type is provided. Session input parameters determine the number of each type of program that is kept active during the session.

The existence time of an individual program also affects the overall frequency of initial load activity. Very short running programs, re-executed frequently, will require more initial program loads per unit period of time. The individual runs comprising the test session may vary, as illustrated in Example 6.

@run run1
@xqt short-program1
@xqt short-program1
@xqt short-program1
@run run2
@xqt long-program1
@run run3
@xqt short-program1
@xqt short-program2
@xqt short-program3
@xqt short-program4
(optional: @start run3)

EXAMPLE 6

A run may optionally restart itself, or start another run, after executing the last program. This has the effect of keeping that run active for long periods of time, without requiring outside intervention.

Figure 2:
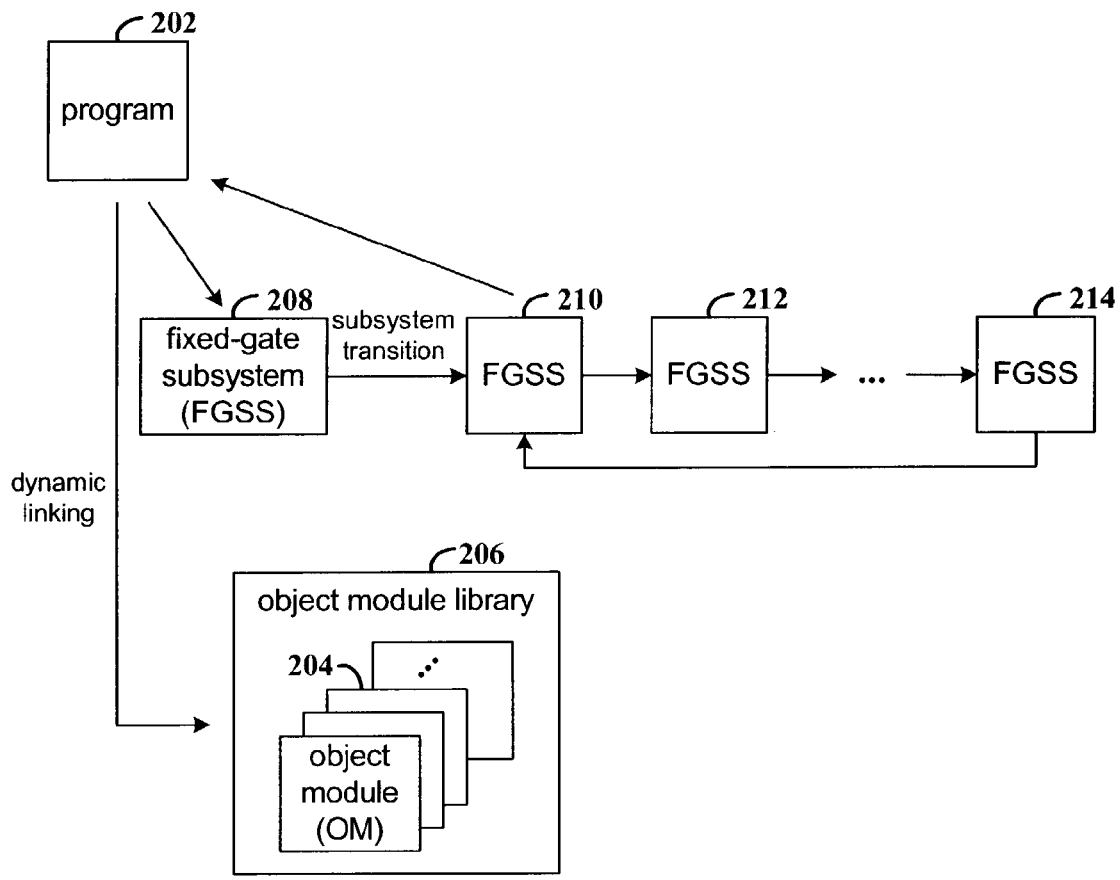
FIG. 2 is a block diagram that illustrates a library of object modules and a fixed-gate subsystem (FGSS) that are included in test arrangement in accordance with another embodiment of the invention.

FIG. 2 is a block diagram that illustrates a library of object modules and a fixed-gate subsystem (FGSS) that are included in test arrangement 100 in accordance with another embodiment of the invention. Along with the data and code banks required for proper program execution, each program 202 includes banks that are the target of I/O and memory transfers. These banks may also be modified (expanded, contracted, or have access permissions changed) by threads in the program. These banks will be verified for correct contents and (depending on the address tree level) may be accessed by many threads and/or programs.

Banks may be included in a number of different ways. In particular, banks may be included at static link time, and become a part of the initial program load. A library of object modules containing statically declared data areas is included in the package. They can be statically linked into any program. Information on these banks can be added to the (program or thread-level) bank information tables of the calling program, by invoking the include_static_banks macro.

Static banks are created at thread or program level only. Static banks may not be deleted. A special flag in the bank information table is used to indicate that a bank was statically defined.

Similarly, banks can be included by dynamically linking to a library object modules. As in the case of static banks, a dynamic call to these object modules results in information on the banks associated with the object module being added to the bank information table.

A call to an object module 204 in library 206 invokes a routine that performs the task of updating the calling programs bank information tables with information on banks it contains. Only those banks that will be used as a target for data accesses and main storage management functions are included. Once the banks have been included in the bank information tables, they can become the target of any future references.

Banks may also be created dynamically by making a (Create$bank) system call. This operating system call can be made at any time during execution, and can be made from any active thread.

Banks can be created at thread, program, or application level. Thread-level banks are accessible only by the calling thread. Information on these banks is kept in the thread-level bank information table unique to that thread. Since these banks are accessible only to a single thread, the thread-level bank information table does not require locking when adding, modifying, or removing information.

Program-level banks are accessible by all threads of the program. Information on these banks is kept in the program-level bank information (one per program). Application-level banks are accessible by all active programs. Information on these banks is kept in a single shared data bank, accessible by all runs. Depending on the security of the system, application-level banks may or may not be allowed to be created from a calling program, without first making a transition to an application level shared subsystem. Program- and application-level bank information tables are protected from simultaneous access by a series of global and local locks.

Banks that are created dynamically may later be modified, or deleted. As with any banks described in the bank information tables these banks are available for referencing and page I/O.

Special handling occurs when the first reference to a fixed gate (or alternate file common bank) subsystem 208 is made. All banks belonging to the shared subsystem are loaded when the first call to the subsystem is made. The subsystem will remain loaded until it is explicitly unloaded, reloaded, or deactivated. Future calls to the subsystem will reference this same copy of the shared banks. Subsystem code is necessarily reentrant.

As is the case with a standard executable program, banks may be created dynamically from within a fixed gate subsystem at thread, program, or application level. Banks that are created within a fixed gate subsystem have a special significance for absolute address space allocation. Banks belonging to standard non-shared executable programs are allocated absolute address space in the (single) home-subsystem sward. Fixed gate (and alternate file common bank) subsystems, on the other hand, are assigned absolute address space in their own sward.

Although a call to a shared subsystem results in a subsystem transition, the executing thread is still the same. Banks created from within the subsystem will be added to the calling run's bank information table(s). General access permission for the banks will be set for read and write, giving threads access to these banks later when they return to the home subsystem. A field in each bank information table entry indicates which subsystem a bank belongs to (the home subsystem or any one of several fixed gate for shared subsystems).

The test arrangement includes support for multiple fixed gate and shared subsystems, for example 210, 212, and 214. These subsystems may be called at any time (invoked by Make_Subsystem_Transition macro) to perform main storage management functions, such as creating, modifying, deleting banks, or referencing pages. Each subsystem transition call first targets an intermediary chameleon FGSS. From the intermediary chameleon FGSS, a specific target shared subsystem is called, or one is selected at random, depending on session parameters. Subsystem calls may be nested, with one shared subsystem calling another shared subsystem(s) before returning back to the home subsystem.

In general a program need not explicitly call a subsystem transition. Each main storage management function (create, modify, delete, reference, page-IO) has periodic subsystem transitions built in. The number and frequency of subsystem transitions is determined by session parameters.

As discussed previously, banks may be created at thread, program or application level. Banks may also be created at different sizes. An option on the call line will indicate whether the calling program will create small banks (size <=262k words), medium sized banks (262k<size<=1meg), large banks (1meg<size<=16meg), or very large banks (size>16meg).

Options may be combined. The default is to create banks from each size range whenever possible. Session input will determine the total number of pages to be allocated, as shown in Example 7.

| | |
|---|---|
| @xqt, sm msm-program-1 only | Create small and medium sized bank |
| @xqt, v msm-program-1 | Create very large banks only |
| @xqt, sml msm-program-1 banks | Create small, medium, or large sized |

EXAMPLE 7

The test arrangement includes a mechanism for controlling the overall level of activity related to allocation and release of memory. Session input parameters are use to influence the behavior by way of build-time parameters, execution-time parameters, and run-control parameters.

Some session input parameters are interpreted at compilation time ("build-time parameters"). Build routines have been created which generate library object modules (static and dynamic) based on input specifications, read in from specially formatted mass storage files. An existing symbolic stream generator tool (SSG) is used to control the build process. However, any tool with similar functionality could be used.

The number of object modules of this type, the sizes (in pages), and the locality of the included banks are all determined by input parameters. Once the build routine has completed, various types and sizes of object modules will be available to which the programs may call or link.

The number of fixed gate and shared subsystems that are created is also determined by input parameters of this type. Each session requires a minimum number of shared subsystems, one to contain the application level bank information table and one to make subsystem transitions. The number of additional subsystems that must be built and installed is determined by session parameters.

Other session input parameters control the execution of the individual programs that comprise the test session ("execution-time parameters"). These input parameters are defined in a user data bank that is linked into each executing program. Input parameters of this type include:

the number and size (in pages) of banks to create at each locality;
the number of pages to allocate within each subsystem;
the number of subsystem transitions to make;
the number (and names) of subsystems to call;
the number of pages to reference;
the number of pages to target for page I/O;
the page reference patterns;
the level of create, modify, delete activity;
the number of threads to create;
the method for distributing work among threads; and
the length of time that the entire session is to remain active.

Run-control parameters are used to control the number of runs (programs) of each type to execute, for example, the number of ZOOM(s), the number of statically linked programs, the number of batch-connect, the number of each size type (S,M,L,V), the number that use dynamic linking, the number that use static linking, the number to include static banks, the number to be long running (entire session duration), and the number to be short running.

Runs are grouped together in various ways to form modules. When runs are selected for execution, they are selected by module name. For example, a session may require five runs from module-1, twenty runs from module-2, eight from module-3, etc.

One module consists of runs that disregard session execution parameters. These runs will create a large number of banks, or reference large numbers of pages, regardless of the session input specifications. Runs from this module can be included to test the behavior of the system under stress conditions, for example, the least recently used algorithm, and paging of LRU data to the page file.

Each program may include multiple threads. These threads will simultaneously create banks, delete banks, expand or contract banks, modify bank attributes, read or write pages, or perform I/O to pages belonging to banks. The amount of activity of each type will depend on session input parameters. If virtual address space management is being stressed, it might be advantageous to frequently delete and recreate new banks or modify existing ones. On the other hand, if the focus of the testing is on physical address space allocation, less activity of this type may be required.

Several different distribution routines are included in the arrangement, including a random routine, a sequential routine, a uniform distribution routine, and a preemptive scheme. Which one is used will depend on session input parameters.

The job of the main controller 102 (FIG. 1) is to keep the requested number of runs from each module active. If each run restarts itself, or starts another run from the same module, the control can be accomplished by building a batch run stream to start each of the runs using input from the session. In an example embodiment, a test tool called Test Activity Controller (TAC) is used to perform this task. This tool has the added benefit that it can start demand or batch runs. It can monitor runs for completion and dynamically report a pass/fail status of each run. The tool can respond to call time parameters, for example, memory management on which to focus testing, and simplify and automate much of the build process.

A number of pre-defined sets (build/execution/run) of session input parameters are included in the test arrangement. These parameters can be used to stress particular functions, such as working set management, or page fault processing. When using TAC to run the session, the user need only supply the name of this parameter set. Specifying a user-defined parameter set is also allowed.

A bank information table contains information on all banks that will be the target of main storage management functions (create, delete, modify, I/O, and memory reference). There is one bank information table per active thread. There is another bank information table (the program level BIT) for each active program. A single application-level bank information table is shared by all active runs.

Banks are added to or removed from the table as they are created or deleted. Valid entries in the table describe banks that are available for reference or modification. Each entry includes information on the number of pages contained in the bank, the start offset, maximum size, and owning subsystem. Bank entries are chained together for ease of addition and removal.

Each entry has flags that indicate whether it is currently being modified, deleted or referenced. Multiple threads may have a bank selected for access. Only one thread at a time may modify or delete a bank. A bank that is being modified or deleted cannot be open for referencing.

A set of two locks, one for bank updates and one for bank accesses, protects the integrity of the table against simultaneous updates. Access counts are updated using atomic storage lock (inc/dec) instructions. The access flag is cleared when no thread is currently accessing the bank.

Multiple threads are allowed to access the same banks and the same pages concurrently. The threads may be performing memory reads, memory writes, or I/O reads and writes. Data written to the banks includes the L,BDI offset (level and bank relative word offset) of the word in memory. All threads write the same data, which allows the data to be verified for correct contents after it has been written.

Figure 3:
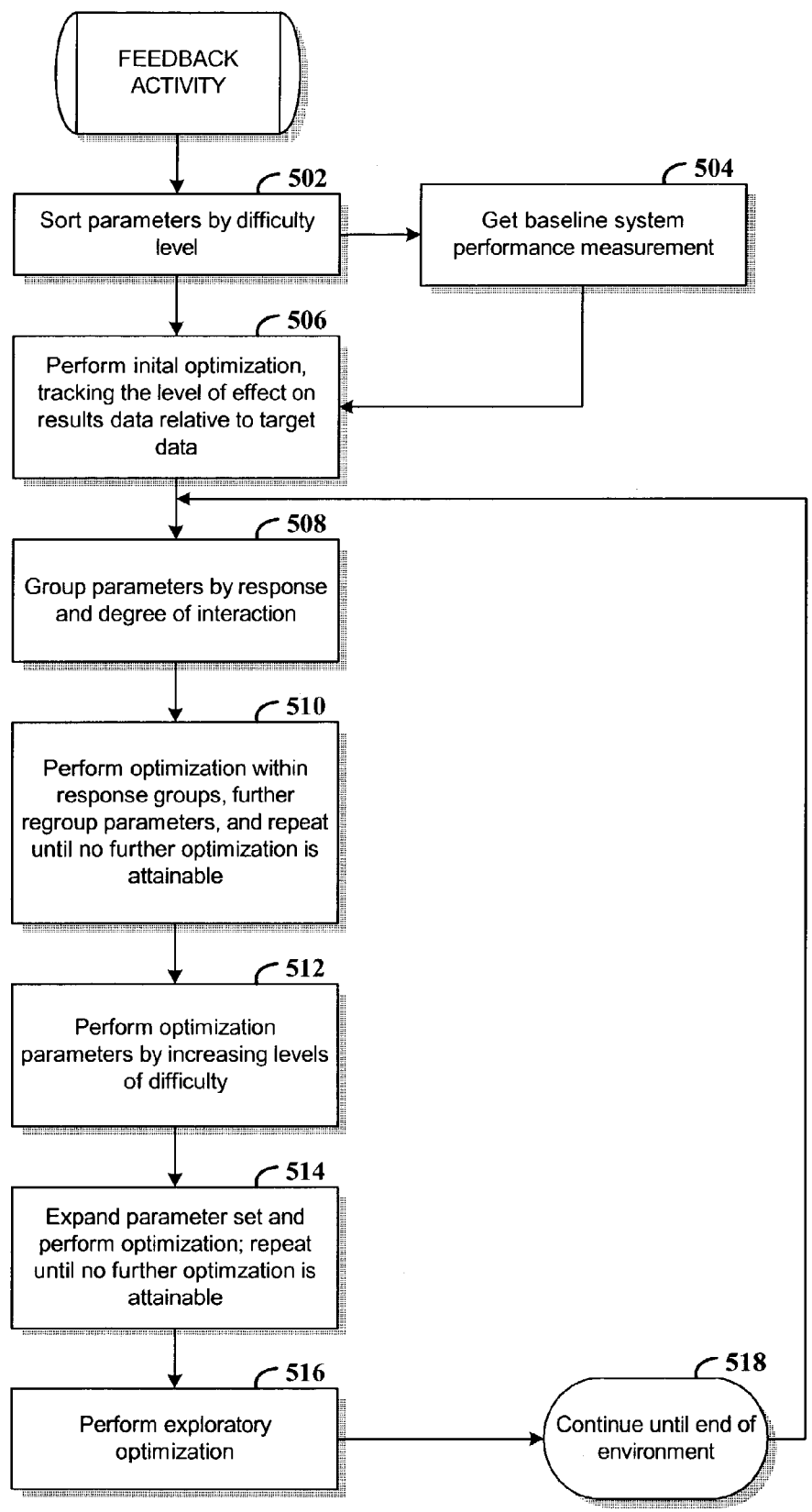
FIG. 3 is a flowchart of a process performed by a feedback activity.

FIG. 3 is a flowchart of a process performed by a feedback activity. The feedback activity routine attempts to find the parameter values that come closest to achieving a system-level test objective and attempts to do so in a minimal amount of time. During optimization, the feedback activity concentrates on those parameters that appear to have the largest positive influence (relative to the system-level goal) on the system behavior. Less time is spent adjusting parameters that have been found to have insignificant or negative affects on the outcome. Parameters that require large amount of time or overhead to change are also adjusted less frequently than other more responsive parameters.

The feedback activity monitors system performance characteristics and adjusts parameter values in order to achieve a certain test objective. The feedback activity is used to evolve parameter sets. Further information on evolving parameter sets is found in the following patents/applications: "METHOD AND SYSTEM FOR TESTING A COMPUTING ARRANGEMENT" by Lang et al., filed on Jun. 6, 2002, having patent/application Ser. No. 10/164,877, and "METHOD AND SYSTEM FOR GENERATING SETS OF PARAMETER VALUES FOR TEST SCENARIOS" by Lang et al., filed on Jun. 6, 2002, having patent/application Ser. No. 10/165,505. The contents of these patents/applications are incorporated herein by reference. The test execution process incorporates changes to the parameters before continuing with the remainder of the test.

The particular parameters selected for adjustment depend on the current test objective and the platform parameters that are available for measurement. For example, if the current test objective is to stress real space allocation and utilization, some of the parameters that might be adjusted include:

1. the number of banks created at each locality, which controls the number of banks that can be loaded into physical memory at one time as well as the amount of memory location access conflicts;
2. the number of concurrent read functions, which controls the amount of simultaneous memory read activity that can take place;
3. the number of concurrent memory write activity that can take place, which controls the amount of simultaneous memory write activity that can take place;
4. the number of concurrent I/O read activities that can take place, which controls the amount of simultaneous I/O read activity that can take place;
5. the number of concurrent I/O write activities that can take place, which controls the amount of simultaneous I/O write activity that can take place; and
6. the number of memory bank creation and deletion activities, which has a direct influence on the accessibility of certain memory areas.

Each of these parameters has a direct impact on the memory data transfer rate and access concurrency that take place across the entire range of the system's physical memory by multiple requesters, as well as the read operations that are necessary to verify data integrity.

Once an initial parameter set has been identified, and baseline measurements have been taken, the feedback activity can begin to make adjustments. The point at which changes to parameter values are incorporated in the executing test is determined by the speed with which the executing code can both recognize and respond to the changes.

When choosing which parameter values to adjust, the feedback activity follows these general rules: 1) values of critical parameters are not changed; 2) the type of the parameter (fixed, restricted, unrestricted) is maintained wherever possible; 3) random parameters are not changed to another type (except under special conditions); 4) changes are made in progressive increments, attempting to remain as close to the original focus area as possible; 5) values of parameters that are more easily acted on by the test execution unit(s) are changed first; and 6) parameter values are selected with the intent of getting closer to the system level goal. Further explanation of the various types of parameters (e.g., critical, fixed, restricted, and unrestricted), as well as focus area are found in the referenced patents/applications.

The parameter definitions further include information that indicates levels of difficulty ("difficulty levels") associated with changing the parameter type and the parameter value relative to incorporation by a test execution unit. This information is used to assess how difficult, how quickly, and at what level a parameter can be adjusted during execution. For example, in 2200 systems, assigning files and creating new processes involve different levels of system overhead. Thus, parameters associated with assigning files will have a different difficulty level than parameters associated with creating new processes. The difficulty levels are assigned by a user.

The number of difficulty levels that are defined and the criteria used for assigning parameters to these levels are implementation dependent. In one embodiment, parameters at the highest difficulty level require significant time and/or overhead to change. For example, changes to a parameter having a high difficulty level may require that execution be temporarily halted or require that changes be made only by the test execution engine, and only at specific times during execution.

Parameters having the lowest difficulty levels, on the other hand, require no special setup. These parameters can be adjusted at any time, and are frequently reread in the main-path of a test execution unit. Generally, parameters having higher difficulty levels are adjusted less frequently than parameters having lower difficulty levels.

In one embodiment, the difficulty levels are divided into two measures. One measure relates to the difficulty involved in reducing the current value of the parameter. The other relates to the difficulty involved in increasing the current value of the parameter. For example, marking a file invalid in a file table for the parameter of the number of target files requires relatively low overhead. However, assigning a new file requires significantly more overhead and can only be accomplished at relatively infrequent intervals during test execution for parameters such as the number of files/device or total number of files.

The parameter type indicates whether the parameter is a fixed value parameter, a restricted range parameter, or a random parameter. The type is not intrinsic to the parameter, but is determined by initial settings. The feedback activity attempts to maintain the parameter type during the course of execution. Fixed parameters remain fixed, restricted range parameters remain restricted range, and random parameters remain random whenever possible.

In addition to the parameter types of fixed, random, and restricted range, parameters can be further subdivided according to the type and number of allowable values. Parameter types refer to the current or assigned parameter values whereas value types refer to the allowable values and methodology for a parameter's modification. In the example embodiment, each parameter can be assigned a value type of discrete range, continuous range, or limited choice. Discrete range parameters are characterized by a relatively small number of possible values. Typically, a discrete range parameter would have less than a hundred possible discrete values. When adjusting discrete range parameters, changes are made incrementally and follow the path of positive change, should one exist. This is based on an initial assumption that the parameter has a linear, exponential, or otherwise continuously increasing, relationship to system behavior. During later optimization stages, when optimization along these lines is no longer possible, deviations from this incremental approach will be allowed.

Continuous range parameters, although not necessarily mathematically continuous, have a sufficiently large number of possible values that attempting them all is not possible. In addition, minor variations typically have little effect. For example, in adjusting the word count in data transfers the range of allowable values is quite large and variations in system behavior when adjusting the value by only a few words is not expected to be significant. When adjusting parameters of this type, a variant of the divide-and-conquer approach is used. The initial value is used to logically divide the range into two portions, and a measurement from each portion is taken. The best measurement becomes the basis for subdividing the portion in which it belongs into two new portions. The process of subdividing the range is repeated until no further progress is made, or the range has reached some minimum size.

Limited choice parameters have a fixed, small number of choices, for example, not more than four or five different values. In addition each different value has unknown effects on the system. For example, finding that an improvement occurred when changing from a first algorithm to a second algorithm allows no prediction as to the effect of changing from the second algorithm to a third algorithm. When selecting values for parameters of this type, each value is selected in turn. Selections can be made in any order. An example limited choice parameter is a workload distribution algorithm.

The feedback activity begins by sorting parameters by difficulty level (step 502), and then obtains baseline system performance measurements (step 504). Assuming three levels of difficulty, parameters are divided into three groups. Groups may include a combination of fixed value, restricted range, or randomly generated parameters depending on the associated difficulty levels. Critical parameters are not included, as they represent parameters that may not be adjusted.

Random (unrestricted) parameters are established as such because these parameters are expected to have an insignificant effect on the ability of the environment to achieve the associated system-level goal. Thus, random parameters are not optimal candidates for change. However, because interactions of variables cannot always be predicted, some exploration of these parameters is included.

In general, the feedback activity first attempts to optimize the set of parameters at the lowest difficulty level. A set of parameters is considered optimized when changes to any one of the set results in a measurement that is equal to the system-level goal, or as is more likely the case, further from the system-level goal than a previous reading. An individual parameter is considered optimized when both positive and negative changes have an adverse effect on the system measurement. It will be appreciated that the optimization is not absolute, but is dependent on the current values of other environmental parameters.

Once all parameters from the lowest difficulty level have been optimized, a single parameter from the next level of difficulty is selected and the value is adjusted until an optimal value is found. The lowest level parameters are then readjusted until they have been optimized relative to the new parameter value in the next level. This process is repeated until all parameters at the next level have been optimized at least once. Then the parameters at the next level of difficulty are optimized, with re-optimization of parameters at the lower levels with each changed parameter value.

At this stage of optimization, parameters at higher levels of difficulty are optimized individually, and parameters at the lower difficulty level are optimized based on changes at the higher levels. However, the original (higher level difficulty) parameter is not readjusted, or treated as part of this optimization set. This limits the number of changes that are made to higher difficulty level parameters. At some point in optimization there may be a time when no further changes parameter in parameter values can be made that will result in a positive gain. The optimization is then considered stable. At this time, boundaries between difficulty levels are removed, and the parameters are treated as one optimized set. In this way, more interactions between parameters can be explored.

When optimizing a set of parameters, the feedback activity proceeds in several stages. Except for the initial optimization stage, the other stages are repeated. The stages are shown in FIG. 3 and further described in the following paragraphs.

During the initial optimization stage (step 506), each parameter is optimized individually using the initial environment parameter values. The best value for a parameter is found while the current values of all other parameters are fixed. Once all parameters have been optimized once, the process is repeated. Because parameters may interact with each other, a change in one parameter value may mean a new optimal value for another. Recall that when fixed value parameters are adjusted, they are adjusted by assigning another fixed value, ideally a value that results in a measurement closer to the system-level goal. An example of this technique for optimizing a fixed value parameter follows.

Consider the case of a fixed, discrete range parameter with an initial value of 3, and an allowable range of [1, 2, 3, . . . , 10]. The first step in optimizing this parameter is to test the two adjacent values, 2 and 4, for the effects on the system performance measurement, and to record the effects of the change relative to the baseline. The next action depends on whether the change is negative, positive, or there is no change.

For example, if best value is currently 3 and the values 2 and 4 both result in a negative change, this stage of optimization is complete, and another parameter is selected for optimization. The current best parameter value remains 3. Note that it is still possible that this parameter may have a positive effect on the environment at some future time, since changes in other parameters may affect the behavior of this one.

If one of the adjacent values (2 or 4) results in a positive change, and the other results in a negative change, subsequent adjustments to the parameter value selections continue in the direction of the positive change, until such time as no further positive change improvement is observed.

If there is no significant change that results from adjacent values (2 or 4), the next adjacent values are selected (1 or 5). If there is still no change, values at the upper and lower bounds of the range are checked. If there is still no change, the parameter is (temporarily) abandoned, and attention turns to another fixed parameter.

When optimizing limited choice parameters, no direction (in terms of relative values) for improvement is assumed. Each value is selected in turn, and its effect on the system is measured. The value with the best (most positive) effect is the one that is selected. Testing of each value can be terminated prematurely in the event that the value of the parameter appears to have no significant effect on the behavior of the system.

For restricted range parameters, a range is selected instead of a single value. During initial optimization, the size of the range is left unchanged. However, the range is shifted to the right or left (numerically), looking for positive or negative changes in the performance measurement. For a discrete range parameter, the shift is one value to the right (or left). For a continuous range parameter, the shift is a selected percentage of the size of the original range, for example, 50%. As with fixed parameters, the shifts continue in the order of positive change.

After the initial optimization, parameters are grouped by response level and degree of interaction (step 508). As adjustments are made, the feedback activity tracks those parameters that appear to have little affect on the performance measurement, those parameters that cause a negative change, and those parameters that cause a significant positive change. The parameters are then grouped by relative response level and degree of interaction within each difficulty level. Those parameters that cause a positive change are placed in a higher level group within the difficulty level. Parameters that have a strong (positive) interaction with other parameters, in particular, specifically, those that require frequent adjustments on subsequent passes through the parameter list, are also placed in a higher level group. Optimization concentrates on those parameters with the most significant and positive interactions. This reordering and grouping of parameters is dynamic, and may change as new parameters or changes are introduced, and new interactions are found. The number of groups within a difficulty level is implementation specific. At a minimum, three groups would be required, one for parameters with positive responses, one for negative responses, and one for limited response.

Figure 4:
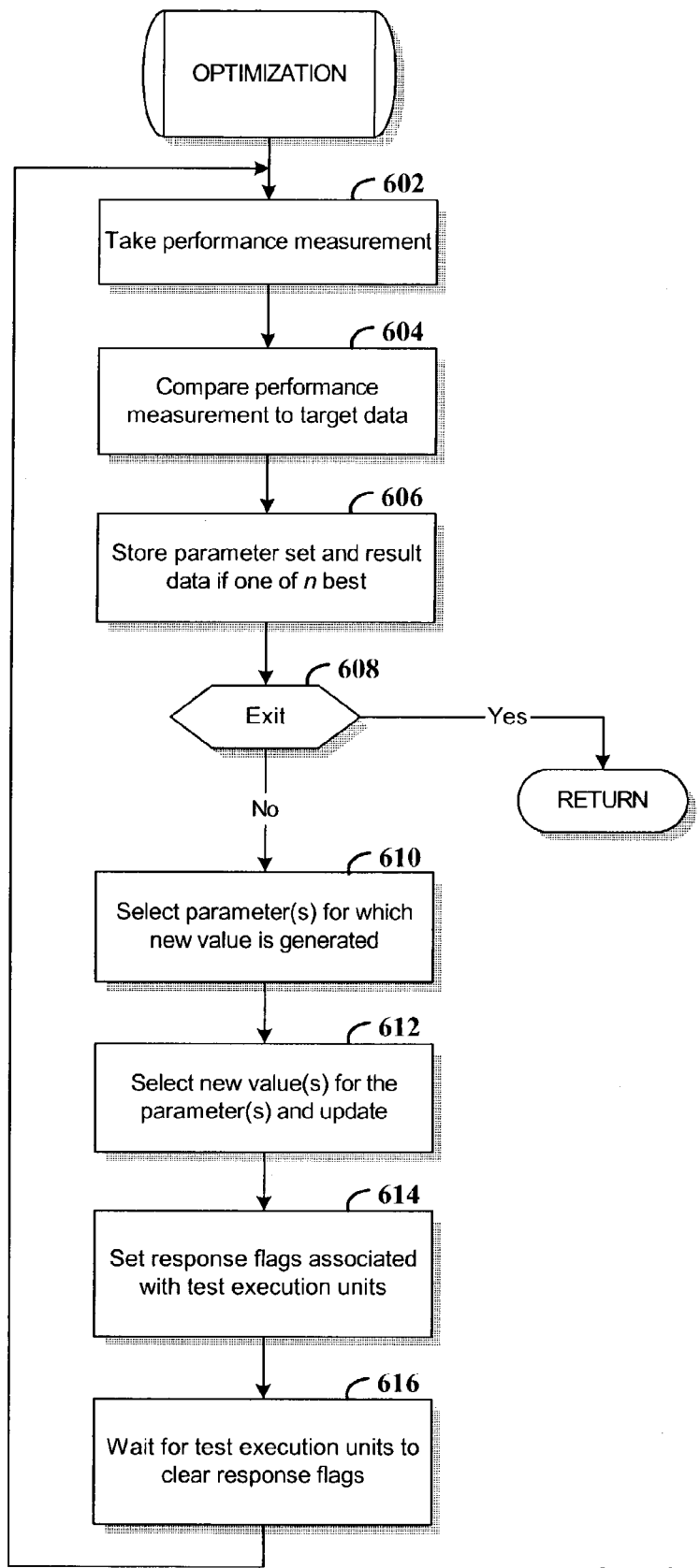
FIG. 4 is a flowchart of a process performed by the feedback activity in optimizing a selected parameter value.

Once the parameters have been grouped, optimization is performed within the response groups (step 510). During the initial optimization stage, several passes through the parameters are made. Information gained with each pass through the parameters is used to separate these parameters into groups according to their level of positive response, and degree of interaction with other parameters. The level of positive response is parameter-specific, relative to the system-level goal, and independent of other parameters. The degree of interaction is a quantitative measurement of how other parameter optimizations are affected by a change in a particular parameter value. Once parameters have been separated into groups, optimization begins to concentrate on those parameters that have been found to exhibit the largest positive results. Parameters in higher-level response groups are optimized more frequently than parameters in lower-level response groups. FIG. 4 illustrates an example process performed for optimization.

If optimization of a response group results in no changes, some steps can be skipped. For example, if optimization of a lower-level response group parameters results in no adjustment from the initial value, no optimization of higher-level response groups is required because there was no change in the lower level response group to affect the higher-level response group. In practice, parameters from the limited or negative interaction sets would infrequently result in changes.

The next stage of optimization optimizes parameters in successive increasing levels of difficulty (step 512). The parameters at each level of difficulty are optimized before continuing with parameters at the next level of difficulty. Based on the current optimized selections, a parameter value is adjusted until an optimal value is found. Again, the process of FIG. 4 is used for optimizing the parameters.

The parameter set is expanded and further optimization is performed after optimizing by increasing levels of difficulty (step 514). Optimization of the expanded parameter set occurs when no further optimization progress can be made by separately optimizing difficult parameters. This stage involves treating all parameters, regardless of their difficulty level as a single parameter set. Parameters are sorted into response groups according to the amount of positive influence and degree of interaction with other parameters in the set. Optimization by group continues as described above, until no further progress can be made.

The final stage of optimization is called the exploratory stage (step 514). During this stage, previously unexplored ranges and parameter values are tested in search of a more optimal solution. Less emphasis is placed on maintaining the same degree of environmental focus, and fewer assumptions are made about the individual functional relationships of parameters.

During the exploratory stage values of random parameters are allowed to vary. In addition, the values for one or more parameters are selected at random, from the set of previously unselected values. This defines a new starting point for the optimization. In "hill-climbing" jargon this constitutes finding a new starting position—one that may allow another (higher) peak to be found. In genetic algorithm jargon, genes are allowed to mutate. Depending on the overhead associated with changing values of difficult parameters, this stage may be moved ahead of the optimization of expanded parameter set stage.

There may be a higher degree of instability, and slightly longer periods of negative improvement during this stage than in other optimization stages. However, because no further improvement was attainable in the other stages, the exploration of other sets of parameter values is considered desirable. For example, consider the case of a fixed parameter having a discrete range of values of 1–10 and an initial value of 3, and a local maximum at this point. The initial value 3 is the best value attained from previous optimization stages. During the exploratory stage, a value is selected from the previously unselected values: 4–10. Unselected values are those allowable values that have not been considered in prior stages of the optimization. Each parameter value in a range has a flag that is used to indicate when a value is selected. Values are selected, until one is found that results in a positive change, or some maximum number of non-positive changes have been attempted. In this case, testing each of the endpoints, as well as one value in the range 5–10 may be considered sufficient.

The exploratory stage for a restricted range parameter involves first contracting, then expanding the current range. Contracting a restricted parameter range uses a divide-and-conquer method similar to that described above in association with adjusting continuous range parameter values.

The exploratory stage also allows ranges to expand into previously unexplored areas of the range. For restricted range parameters, the original range is abandoned, and a new, larger range is defined. The new range spans the entire range of defined values for the parameter. The divide-and-conquer method is then used to find some subset of this range that produces results closer to the system level goal being measured.

In the case of a random parameter, the first step is implied, as the range of a random parameter is, by definition, the entire range of parameter values.

Without significant additional overhead, it is possible for the feedback activity to monitor the behavior of the system in other (non-goal) areas. For example, if the system level goal of the environment is to maximize the number of write bytes transferred per second, the feedback activity routine could simultaneously measure the average I/O queue size, the total number of requests per second, and the number of split requests. If desired, separate records could be kept for each of these measurements as well. Parameters are adjusted for maximum bytes per second. However, if during the course of this optimization one of the other measurements was found to exceed the previous "best" measurement, the saved set of parameter values could be updated.

This auxiliary information could be used to supply initial starting parameter values for the environment if the user wishes to override the environment goal. For example, the user may want to verify the integrity of word addressable files under conditions of maximum page faults, rather than maximum I/O volume.

FIG. 4 is a flowchart of a process performed by the feedback activity in optimizing a selected parameter value. The optimization process monitors the performance of the system by taking a performance measurement in a selected area of the system (step 602). The number and type of performance measurements that can be taken to support a given test objective depend on the specific platform under test. Example performance measurements include:

1. the amount of memory active, which indicates how much of the available system memory is actively being used;
2. the number of create bank requests, which indicates the number of new memory space allocations that are being requested;
3. the number of delete bank requests, which indicates the number of requests to release areas of memory in use;
4. the number of page faults per second, which indicates the amount of program memory pages that must be loaded into memory;
5. the number of working sets active, which indicates the amount of program memory that is being loaded/unloaded to/from system memory and mass storage; and
6. the number of I/O operations per second, which indicates the level of I/O activity to/from main memory.

These measurements allow the test to determine the extent and manner to which system memory is being utilized. If it is determined that insufficient memory is being utilized to meet the test objective, the amount of allocated system memory can be increased accordingly. If the type of utilization does not meet the test objective, the ratio of the required access functions can be modified to meet the test requirements.

The performance measurement is compared to a target value for the environment (step 604), and the set of parameter values is stored if the performance measurement is one of n best measurements taken (step 606). It will be appreciated that storage of the set of parameter values is made by type of computing arrangement in accordance with one embodiment of the invention.

If the optimization process determines that either performance measurement has reached a desired level or that no further progress is expected (decision step 608), the process returns control to the feedback activity of FIG. 3. Otherwise, one or more parameters are selected for generation of new parameter values (steps 610, 612). The response flags associated with the changed parameter values are set for the test execution units (step 614). When all the test execution units have responded by clearing the respective response flags (step 616), the optimization process returns to take another performance measurement (step 602).

Accordingly, the present invention provides, among other aspects, a method and apparatus for verification of memory management functions. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A system for testing memory management functions of a data processing system, comprising:
   a controller configured to start and monitor progress of one or more programs;
   each of the one or more programs configured to start a number of threads as specified by input parameter values, wherein a selected number of the programs are dynamically linked and a selected number of the programs are statically linked in response to the input parameter values;
   at least one or more of the threads configured to create, modify, and delete one or more memory areas; and
   a feedback activity configured to measure performance characteristics of the data processing system while the one or more threads are executing and selectively adjust, in response to the performance characteristics relative to target performance characteristics, the input parameter values.

2. The system of claim 1, wherein the controller is further configured to maintain concurrency of at least two programs in response to the input parameter values.

3. The system of claim 2, wherein the controller is further configured to control a quantity of address space accessible to the programs and threads in response to the input parameter values.

4. The system of claim 3, wherein at least one of the programs is dynamically linked, and at least one of the programs is statically linked.

5. The system of claim 4, wherein at least one of the memory areas is statically linked to at least one of the programs.

6. The system of claim 5, wherein at least one of the memory areas is dynamically linked to at least one of the programs.

7. The system of claim 6, wherein at least one of the memory areas is accessible to only one thread, and at least one of the memory areas is accessible to all threads of a program.

8. The system of claim 7, wherein at least one of the memory areas is accessible to all the threads of all the programs.

9. The system of claim 8, wherein at least one of the programs is configured to start an activity monitor, and the activity monitor is configured to indicate memory functions to exercise to the one or more threads started by the program.

10. The system of claim 9, wherein the activity monitor is further configured to select numbers of the memory functions to exercise in response to the input parameter values.

11. A method for testing memory management functions of a data processing system, comprising:
   starting one or more programs;
   monitoring progress of the one or more programs;
   starting, by each of the one or more programs, a selected number of threads as specified by input parameter values;
   dynamically linking a selected number of the programs in response to the input parameter values;
   statically linking a selected number of the programs in response to the input parameter values;
   creating, modifying, and deleting one or more memory areas by at least one of the threads;
   measuring performance characteristics of the data processing system while the one or more threads are executing and selectively adjusting, in response to the performance characteristics relative to target performance characteristics, the input parameter values.

12. The method of claim 11, further comprising maintaining concurrency of at least two programs in response to the input parameter values.

13. The method of claim 12, further comprising controlling a quantity of address space accessible to the programs and threads in response to the input parameter values.

14. The method of claim 13, further comprising dynamically linking at least one of the programs, and statically linking at least one of the programs.

15. The method of claim 13, further comprising statically linking at least one of the memory areas to at least one of the programs.

16. The method of claim 15, further comprising dynamically linking at least one of the memory areas to at least one of the programs.

17. The method of claim 16, further comprising limiting access to at least one of the memory areas to only one thread, and providing access to at least one of the memory areas to all threads of a program.

18. The method of claim 17, further comprising providing access to at least one of the memory areas to all the threads of all the programs.

19. The method of claim 18, further comprising starting an activity monitor and indicating, by the activity monitor, memory functions to exercise to the one or more threads.

20. The method of claim 19, further comprising selecting numbers of the memory functions to exercise in response to the input parameter values.

21. An apparatus for testing memory management functions of a data processing system, comprising:
   means for starting one or more programs;
   means for monitoring progress of the one or more program;
   means for starting, by each of the one or more programs, a selected number of threads as specified by input parameter values, wherein a selected number of the programs are dynamically linked and a selected number of the programs are statically linked in response to the input parameter values;
   means for creating, modifying, and deleting one or more memory areas by at least one of the threads;
   means for measuring performance characteristics of the data processing system while the one or more threads are executing and selectively adjusting, in response to the performance characteristics relative to target performance characteristics, the input parameter values.

* * * * *